(12) United States Patent
Zhou et al.

(10) Patent No.: US 10,074,919 B1
(45) Date of Patent: Sep. 11, 2018

(54) BOARD INTEGRATED INTERCONNECT (71) Applicant: INTEL CORPORATION, Santa Clara, CA (US)

(72) Inventors: Zhen Zhou, Chandler, AZ (US); Daqiao Du, Lake Oswego, OR (US); Anne M. Sepic, Chandler, AZ (US); Kai Xiao, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/625,149

(22) Filed: Jun. 16, 2017

(51) Int. Cl.
| | |
|---|---|
| H01R 12/00 | (2006.01) |
| H01R 12/71 | (2011.01) |
| H01R 12/75 | (2011.01) |
| H01R 43/20 | (2006.01) |
| H05K 1/09 | (2006.01) |
| H05K 1/02 | (2006.01) |
| H05K 1/11 | (2006.01) |
| H05K 3/46 | (2006.01) |
| H05K 3/00 | (2006.01) |

(52) U.S. Cl.
CPC .......... *H01R 12/714* (2013.01); *H01R 12/75* (2013.01); *H01R 43/205* (2013.01); *H05K 1/0298* (2013.01); *H05K 1/09* (2013.01); *H05K 1/115* (2013.01); *H05K 3/0011* (2013.01); *H05K 3/4644* (2013.01); *H05K 2201/0939* (2013.01); *H05K 2201/09545* (2013.01); *H05K 2203/06* (2013.01)

(58) Field of Classification Search
CPC .... H01R 12/714; H01R 12/75; H01R 43/205; H05K 1/0298; H05K 1/09; H05K 1/115; H05K 3/0011; H05K 3/4644; H05K 2201/0939; H05K 2201/09545; H05K 2203/06
USPC .......................................................... 439/63
See application file for complete search history.

(56) References Cited

U.S. PATENT DOCUMENTS

| | | | | |
|---|---|---|---|---|
| 4,628,409 A | * | 12/1986 | Thompson | H05K 1/115 228/180.1 |
| 5,175,060 A | * | 12/1992 | Enomoto | H01L 21/4825 216/14 |
| 5,791,911 A | * | 8/1998 | Fasano | H01R 12/57 439/63 |
| 6,261,467 B1 | * | 7/2001 | Giri | H01L 23/5383 216/13 |
| 6,376,052 B1 | * | 4/2002 | Asai | H05K 3/0094 174/255 |

(Continued)

*Primary Examiner* — Abdullah Riyami
*Assistant Examiner* — Vladimir Imas
(74) *Attorney, Agent, or Firm* — Schwabe, Williamson & Wyatt, P.C.

(57) ABSTRACT

Embodiments of the present disclosure may relate to a printed circuit board (PCB) that includes a first outer layer and a second outer layer opposite the first outer layer. The PCB may further include a routing layer between the first outer layer and the second outer layer, and an interconnect positioned within the first outer layer and coupled with the routing layer. The interconnect may include a contact within an opening in the first outer layer, wherein the contact is within a plane defined by an outer surface of the first outer layer. The interconnect may further include a plated via directly coupled with the contact and the routing layer. Other embodiments may be described or claimed.

20 Claims, 8 Drawing Sheets

(56) References Cited

U.S. PATENT DOCUMENTS

| | | | | |
|---|---|---|---|---|
| 6,490,170 B2 * | 12/2002 | Asai | H01L 23/49816 | 361/794 |
| 6,506,982 B1 * | 1/2003 | Shigi | H05K 3/403 | 174/260 |
| 6,524,115 B1 * | 2/2003 | Gates | G01R 1/0408 | 439/66 |
| 6,630,631 B1 * | 10/2003 | Dishongh | H05K 1/113 | 174/260 |
| 6,750,403 B2 * | 6/2004 | Peterson | H05K 1/0218 | 174/255 |
| 7,049,929 B1 * | 5/2006 | Fjelstad | H01C 7/005 | 338/252 |
| 7,172,431 B2 * | 2/2007 | Beaman | G01R 1/06716 | 439/66 |
| 7,371,974 B2 * | 5/2008 | Toyoda | H01L 21/486 | 174/262 |
| 7,378,745 B2 * | 5/2008 | Hayashi | H01L 23/49816 | 257/700 |
| 7,517,730 B2 * | 4/2009 | Cho | H05K 3/4007 | 174/262 |
| 8,110,750 B2 * | 2/2012 | Inagaki | H01L 21/4857 | 174/260 |
| 8,125,792 B2 * | 2/2012 | Kawabata | H05K 1/0268 | 174/261 |
| 8,188,373 B2 * | 5/2012 | Hunrath | H05K 1/0271 | 174/257 |
| 8,440,916 B2 * | 5/2013 | Li | H05K 3/0032 | 174/250 |
| 8,723,047 B2 * | 5/2014 | Shen | H05K 1/0218 | 174/251 |
| 8,911,266 B2 * | 12/2014 | Kawate | G01R 1/0483 | 439/700 |
| 8,997,341 B2 * | 4/2015 | Ejiri | H05K 3/244 | 174/257 |
| 9,013,894 B2 * | 4/2015 | Yamamoto | H05K 1/116 | 174/257 |
| 9,185,804 B2 * | 11/2015 | Isono | H05K 1/0243 | |
| 9,192,044 B2 * | 11/2015 | Hayashi | H05K 1/0216 | |
| 9,686,862 B2 * | 6/2017 | Daghighian | H05K 1/115 | |
| 9,735,484 B2 * | 8/2017 | Brubaker | H01R 12/53 | |
| 2014/0273641 A1 * | 9/2014 | Light | H01R 43/16 | 439/625 |

* cited by examiner

BOARD INTEGRATED INTERCONNECT

FIELD

Embodiments of the present disclosure generally relate to the field of testing equipment, and more particularly, for testing equipment interconnects.

BACKGROUND

Testing equipment may be used to measure characteristics of various devices under test (DUTs). Specifically, the testing equipment may be communicatively coupled with the DUT to record or measure various signals within or exported by the DUT. For example, sockets of the testing equipment may be coupled with a number of interconnects of the DUT such as a ball grid array (BGA), which may include a plurality of solder balls arranged in an array.

In legacy test equipment, the sockets may include, for example, a spring-loaded pin socket, a stamp pin socket, or an elastomer socket. The sockets may be used as a temporary interface between the DUT and the test equipment for high volume product testing. However, the additional interconnect provided by this socket may result in one or both of two adverse impacts. The first adverse impact may include signal integrity degradation, mainly induced by added contact pin height and the mechanism for holding such long pins in place. That is, reduction of signal integrity between the DUT and the test equipment. The second adverse impact may include deviation from the product native operation configuration. In other words, the DUT may not be operating in the same manner, or with the same connections, as it would operate in normal (non-test) use.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Generally, embodiments may relate to a test equipment wherein interconnects are fabricated directly on the motherboard (MB) printed circuit board (PCB). The interconnects may serve as the shortest possible electrical interconnect between the MB and the DUT. The interconnects may also serve as an alignment mechanism and a mechanical compliance mechanism.

Embodiments may provide a variety of advantages such as signal integrity, cost, test accuracy, form factor, and data rate scalability. For example, with respect to signal integrity, embodiments may provide a shorter electrical path from the DUT to the MB of the test equipment, or from the DUT to the instrument, than legacy solutions. As such, embodiments may offer a propitious solution for the signal integrity of high-speed input/outputs (I/Os) at native MB thickness or less without additional pin height. Additionally, embodiments may provide a direct connection from the BGA of the DUT to inner layers of the MB, which may further reduce the signal degradation caused by the transition from one interconnect to another.

With respect to cost, embodiments may integrate the test interconnect with the MB of the test equipment, which may ultimately eliminate some of the costly auxiliaries required by legacy solutions. Such auxiliaries may include, for example, socket or connector frames, pins (which may increase the cost of legacy solutions), and alignment features.

With respect to test accuracy, in its native operational condition, the DUT may be either soldered down to an MB of a computing device in which it is operating, or it may be mounted on top of a socket with relatively short pins. Because embodiments herein may provide direct interconnects from the DUT to the test equipment, the discrepancy between the DUT's test condition and its operation condition may be reduced or eliminated, resulting in an increased test accuracy.

With respect to the form factor, embodiments may embed the interconnect in the MB of the test equipment. As such, embodiments may not require the "keep out" zone that may be required by a legacy socket or connector. Removal of the "keep out" zone may result in a smaller form factor than seen in legacy devices.

With respect to data rate scalability, embodiments may provide an interconnection between the DUT and the MB of the test equipment that is almost transparent to the signal passing between the DUT and the MB. As such, signal performance may not degrade appreciably with data rate scaling.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Generally, embodiments herein may include one or more of the following aspects, as will be discussed in further detail below. Some embodiments may include a BGA-guide feature built into the MB PCB. Some embodiments may include Beryllium Copper (BeCu) contact configurations that serve dual functionalities such as being both the contact and a spring-load. Some embodiments may include a multi-layer direct connection. Some embodiments may include a mechanical loading mechanism for contact support. Some embodiments may include tips fabricated on the BeCu contact surface. Some embodiments may include a PCB guided direct contact from the BGA to a coaxial cable.

Figure 1:
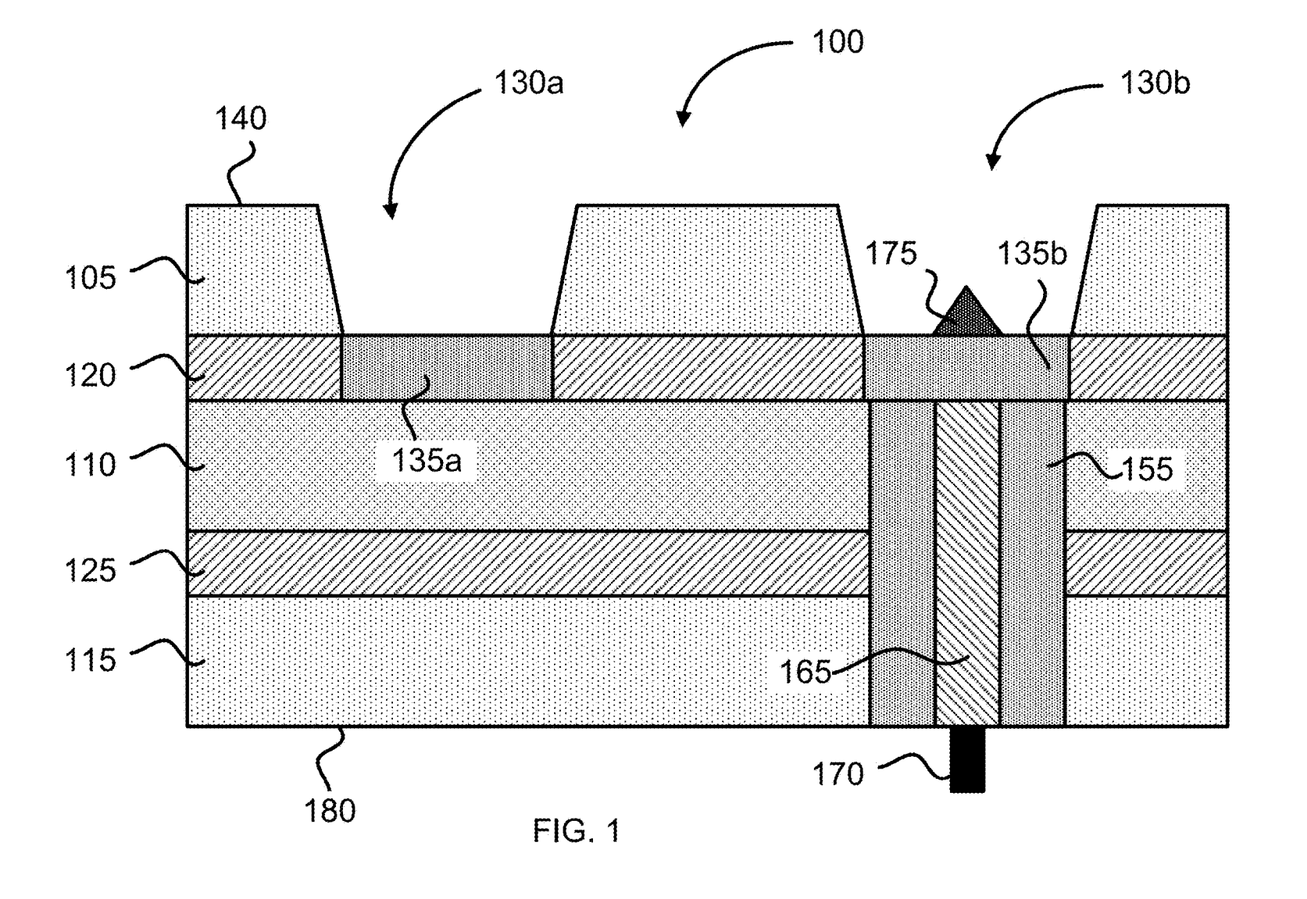
FIG. 1 depicts an example test equipment, in accordance with various embodiments.

FIG. 1 depicts an example MB 100 for a test equipment. The MB 100 may include at least an outer layer such as outer layer 105 and outer layer 115. The outer layers 105 and 115 may be formed of a dielectric material such as prepreg material. The prepreg material may include, for example, a cloth or fiber material and a resin material used to strengthen the cloth/fiber material. Some prepreg materials may include, for example, polytetrafluoroethylene (Teflon), FR-4, FR-1, CEM-1, CEM-3, etc. In other embodiments, the outer layers 105 or 115 may be a different type of dielectric material. In some embodiments, the outer layers 105 and 115 may be a different type of dielectric material than one another.

The MB 100 may also include one or more separation layers such as separation layer 110. The separation layer 110 may be a dielectric material such as one of the prepreg materials described with respect to outer layer 105 or 115, or some other prepreg material. In some embodiments, the separation layer 110 may be the same prepreg material or a different prepreg material than one or both of outer layers 105 or 115. In some embodiments, the separation layer 110 may be a different type of dielectric material such as glass, ceramic, an ajinomoto build-up film (ABF), or some other type of dielectric material.

The MB 100 may also include one or more routing layers 120 and 125 that may be designed to route electrical signals from one component or connection to another component or connection. The routing layers 120 and 125 may include one or more contacts such as contacts 135a or 135b as shown in routing layer 120. In some embodiments the contacts 135a, 135b may be an element of the routing layer 120 that is not distinct from the routing layer 120. In some embodiments the contacts 135a, 135b may be separate from, but embedded within the routing layer 120. In some embodiments (not shown), the contacts 135a, 135b may have a width that is different than the width of the routing layer 120. In other words, the contacts 135a, 135b may not extend fully through the routing layer 120. In some embodiments (not shown), the contacts 135a, 135b may be positioned on top of, rather than within, the routing layer 120. The contacts 135a and 135b are described in greater detail below. The routing layers 120, 125 may include a conductive material or metal such as copper, gold, or some other material or alloy thereof.

The MB 100 may also include one or more openings 130a and 130b in the outer layer 105 of the MB 100. The openings 130a and 130b may have one or more contacts 135a and 135b positioned within. Contact 135a or 135b may be a conductive material such as BeCu, copper, gold, or some other conductive material. In some embodiments, contact 135a may be formed of the same material as contact 135b, while in other embodiments contacts 135a and 135b may be different materials. Similarly, contacts 135a or 135b may be formed of the same material as routing layer 120, or of a different material. As can be seen in FIG. 1, the contacts 135a and 135b may be below the outer surface 140 of the outer layer 105. To put it another way, the contacts 135a and 135b may be referred to as "within" the outer layer 105.

Openings 130a and 130b may be generally frusto-conical wherein the diameter at outer surface 140 of outer layer 105 may be larger than the diameter of the opening at the side of outer layer 105 that attached to routing layer 120. In other embodiments, openings 130a or 130b may have a different cross-sectional shape such as a square shape, an octagonal shape, etc.

In some embodiments a contact such as contact 135a may only be electrically coupled with routing layer 120. However, a contact such as contact 135b may be coupled with a via such as via 155. Via 155 may allow a communicative coupling from the outer surface 180 of outer layer 115 to contact 135b. In some embodiments, via 155 may also be coupled with routing layer 125, as shown, such that electrical signals may be passed between routing layer 125 (or a component coupled thereto) and contact 135b. In other embodiments, the via 155 may be electrically insulated from the routing layer 125 by a material such as a dielectric material (not shown for clarity).

The via 155 may be formed of a conductive material such as copper or some other conductive material. In some embodiments, via 155 may be formed by first drilling a hole in separation later 110, outer layer 115, or routing layer 125, and then coating the surface of the hole with a conductive material via a process such as an electroplating process. Such a via may be referred to as a "plated through hole via." In other embodiments, via 155 may be formed via a different technique or process, or the conductive elements of via 155 may be formed via a different technique or process. Additionally, it will be understood that the depiction of MB 100 in FIG. 1 is intended as a cross section. In embodiments, the via 155 may be generally cylindrical, or have some other cross-sectional shape such as octagonal, square, etc.

In some embodiments, the MB 100 may include one or more mechanical loading mechanisms such as loading mechanisms 165. The loading mechanisms 165 may be, for example, a spring, an elastomer, a rubber cylinder, etc. In embodiments, the loading mechanisms 165 may be conductive or non-conductive. The loading mechanisms 165 may allow the MB 100 to provide more compression of contacts 135a and 135b to the BGA of a DUT, and sustain a higher loading force. For example, when a BGA of a DUT is positioned within opening 130b and compressed against contact 135b, the loading mechanism 165 may compress slightly and provide a force against contact 135b, thereby pushing contact 135b back "upward" (as shown with respect to FIG. 1) and against the BGA.

Generally, a contact and via may form an interconnect. For example, FIG. 1 may depict two interconnects within the MB 100. The first interconnect may include contact 135a. The second interconnect may include contact 135b and via 155. The second interconnect may optionally be considered to include loading mechanisms 165. In some embodiments an interconnect, for example, the second interconnect, may include a coaxial cable 170 protruding from the outer layer 115. The coaxial cable 170 may be directly coupled with contact 135b, and so be able to pass electrical signals directly to or from contact 135b. In embodiments where the coaxial cable 170 is present, the contact 135b may not be electrically coupled with the via 155. Rather, the outer conductor of the coaxial cable 170 may contact via 155.

In some embodiments, one or both of the contacts 135a, 135b may have a tip such as tip 175 positioned thereon. The tip 175 may be formed of a relatively hard conductive material such as conductive rubber with hard gold plating thereon, or hard gold or palladium built-up on a spring-loaded supporting structure that is able to scratch and/or otherwise penetrate the oxidized layer of a BGA solder ball to allow better electrical coupling of the contacts 135a, 135b with the BGA solder ball. In some embodiments, the tip 175 may be a cone shape, a crow tip, or some other shape. In some embodiments, the tip 175 may be an integral element of a contact such as contact 135b (that is, formed at the same time as the contact 135b), while in other embodiments the tip 175 may be built upon the contact.

Although a specific number of layers and or elements may be depicted in FIG. 1, FIG. 1 is intended as an example, and in other embodiments a different number or configuration of layers or elements may be present. For example, in some embodiments the outer layer 115 may not be present; rather, routing layer 125 may serve as the "bottom" of the MB 100. In some embodiments, there may be additional separation layers or routing layers. In some embodiments, although only 2 openings 130a and 130b are depicted in MB 100, in other embodiments a test equipment may be configured with a larger number of openings such as between 10 openings and 4000 openings, or some other number of openings. Generally, the number of openings may depend on the number of interconnects required by design specifications of the DUT. The various contacts such as contacts 135a, 135b, or other contacts may be communicatively coupled with different ones of the routing layers, or include coaxial cables, than those shown in FIG. 1.

The MB 100 of FIG. 1, when used in a test equipment, may provide various benefits over legacy test equipment. For example, the openings 130a and 130b may serve as a receptacle to guide solder balls of a BGA of a DUT against contacts 135a and 135b. Additionally, the direct connection of the BGA of the DUT to an inner layer of the MB such as routing layers 120 or 125 may be realized through the contacts 135a or 135b.

Figure 7:
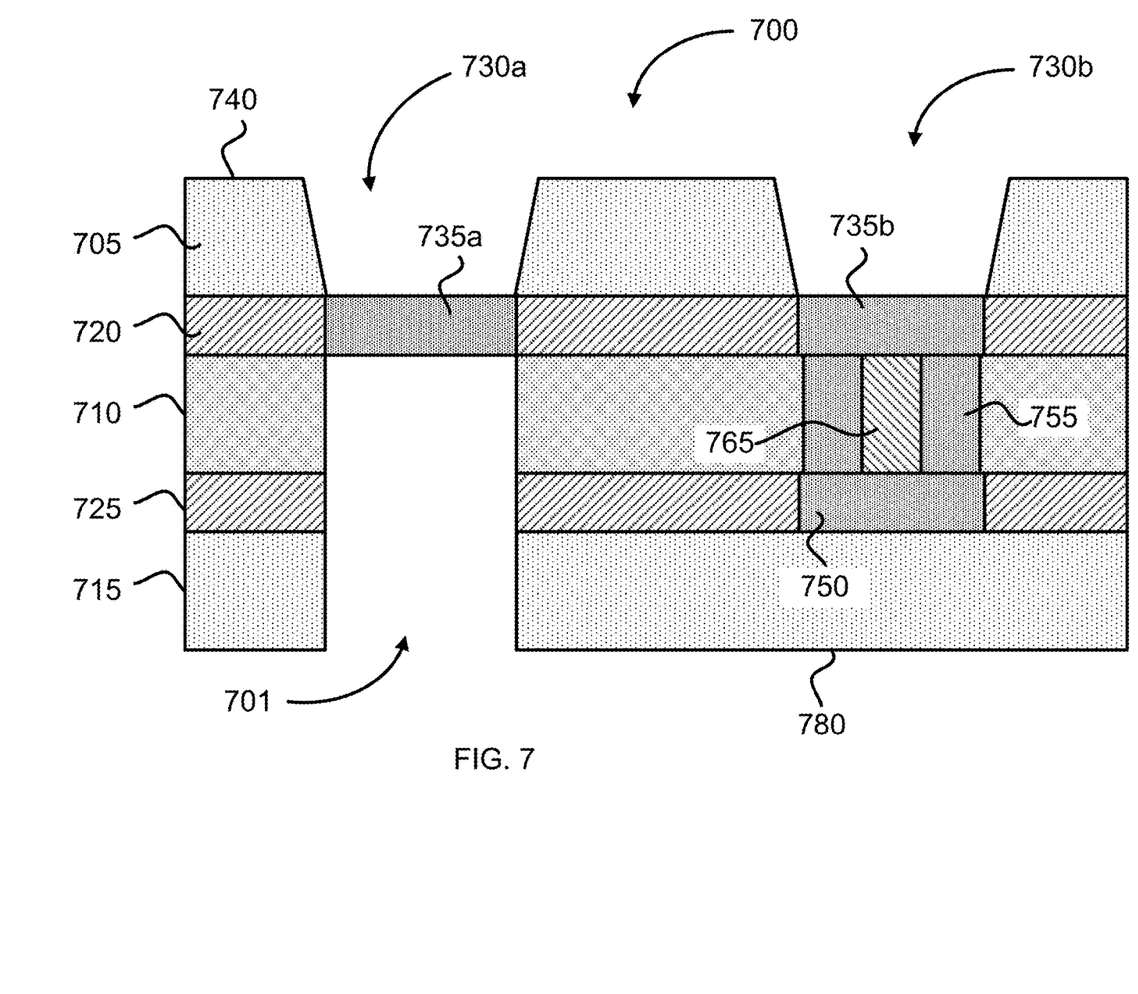
FIG. 7 depicts an alternative example test equipment, in accordance with various embodiments.

FIG. 7 depicts an alternative example test equipment, in accordance with various embodiments. Specifically, the test equipment may include a MB 700 which may have outer layer 705 with outer surface 740, routing layer 720, separation layer 710, routing layer 725, and outer layer 715 with outer surface 780, which may be respectively similar to outer layer 105 with outer surface 140, routing layer 120, separation layer 110, routing layer 125, and outer layer 115 with outer surface 180. The MB 700 may further include openings 730a, 730b, with contacts 735a, 735b positioned therein, which may be respectively similar to openings 730a, 130b and contacts 135a, 135b.

MB 700 may include an opening 701 through the layers such as routing layer 725, separation layer 710, and outer layer 715 such that contact 735a is accessible through the side of the MB opposite outer layer 705.

As shown in FIG. 7, MB 700 may further include a via such as via 755, which may be similar to via 155. Via 755 may have a loading mechanism 765 (which may be similar to loading mechanism 165) positioned within. However, via 755 may only extend as far as routing layer 725, and couple with contact 750. Contact 750 may be similar to contact 735b, and may be electrically coupled with routing layer 725. In embodiments, contact 750 may be formed of the same material as routing layer 725, or a different material. The contact 750 may be formed at the same time as routing layer 725, or may be formed separately from routing layer 725. In embodiments, the via 755 may be a plated through hole (PTH) via, and the loading mechanism 765 may be inserted into the via 755 from outer surface 780 of the MB 700.

It will be understood that the various configurations shown in FIGS. 1 and 7 are examples and in other embodiments various aspects of FIG. 1 or 7 may be combined. For example, in some embodiments a MB may have combinations of aspects of both FIGS. 1 and 7 such as the contact 135a and the contacts 735a/opening 701. Other similar combinations of the various configurations may be used in other embodiments.

Figure 8:
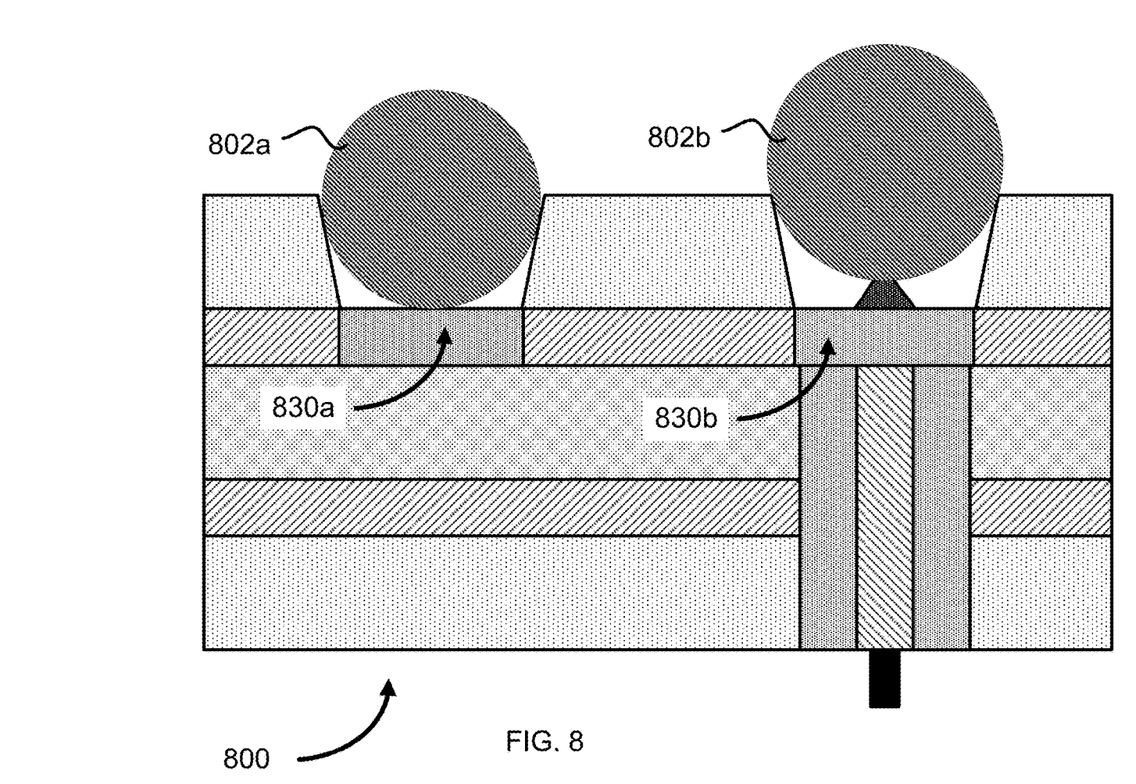
FIG. 8 depicts an example test equipment coupled with a BGA ball, in accordance with various embodiments.

FIG. 8 depicts an example test equipment coupled with a BGA ball, in accordance with various embodiments. Specifically, in this example FIG. 8 depicts a MB 800 that may be similar to MB 100. The various elements of MB 800 are not re-numbered for the sake of clarity. MB 800 may include an opening 830a and an opening 803b, which may be respectively similar to openings 130a and 130b. In this embodiments, BGA balls 802a and 802b may be positioned within openings 830a and 830b as described herein.

It will be understood that although MB 800 is similar to MB 100, in other embodiments MB 800 may be similar to MB 700, or some combination of MBs 100 and 700.

Figure 2:
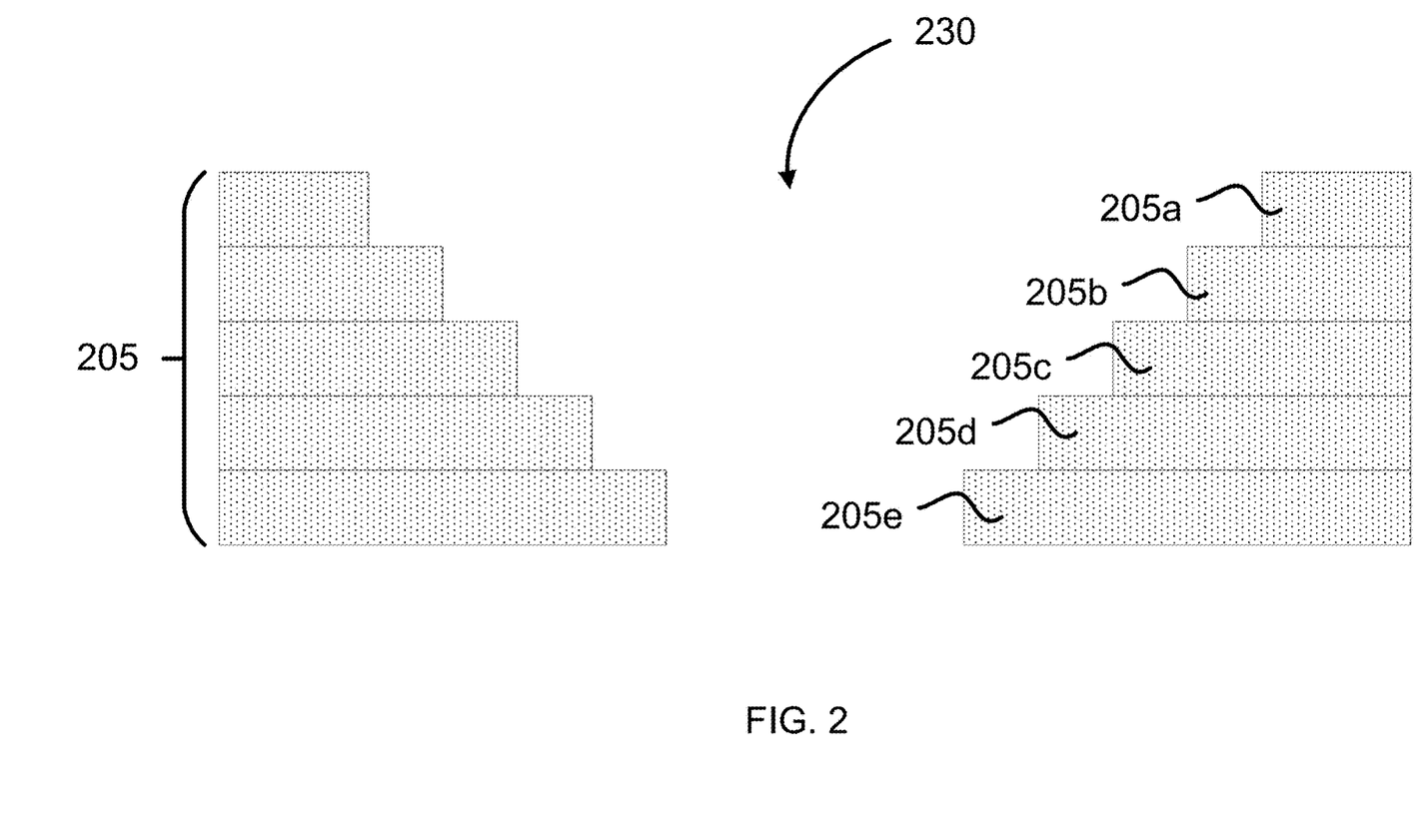
FIG. 2 depicts an example of an outer layer of a test equipment, in accordance with various embodiments.

In embodiments, an opening such as openings 130a, 130b, 730a, 730b may be formed by a process such as mechanical drilling with a countersink drill bit. In other embodiments the openings may be formed through a different technique. For example, FIG. 2 depicts an alternate opening 230 in a layer 205. Layer 205 may be similar to outer layer 105 in that it may be formed of a prepreg or similar dielectric material. However, as shown in FIG. 2 layer 205 may be formed of a plurality of different layers 205a-205e. The opening 230 may be formed via laser trepanning each of the layers with a decreasing diameter as shown in FIG. 2. For example, the diameter of the opening at layer 205a may be greater than the diameter of the opening at layer 205b.

It will be understood that FIG. 2 is intended as one example, and in other embodiments the layer 205 may have a different number of discrete layers (that is, more layers or fewer layers than those shown in layers 205a-205e). In some embodiments, layer 205 may be a singular layer with a variety of diameters. In some embodiments an opening such as opening 230 may be formed via a different technique such as chemical etching or some other process.

Figure 3A:
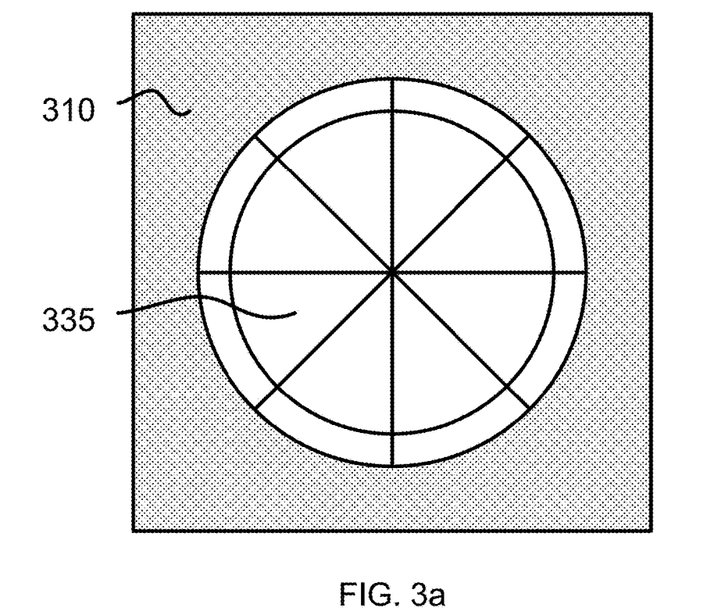
FIGS. 3a and 3b depict an example of a contact of a test equipment, in accordance with various embodiments.
Figure 3B:
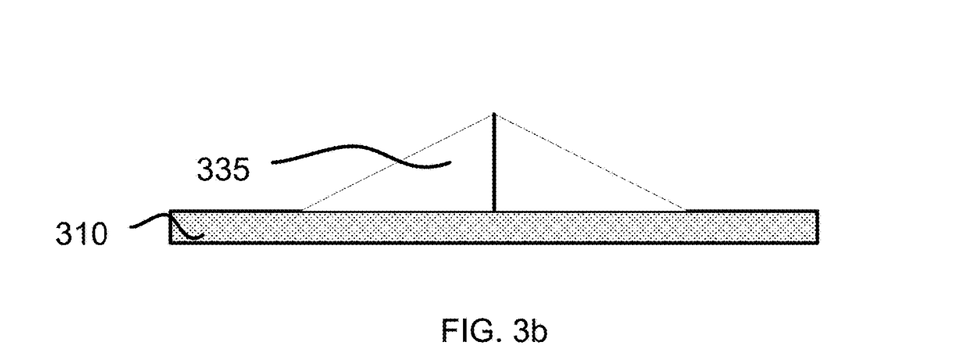

In some embodiments, a contact such as contact 135a or 135b may serve a dual functionality. Specifically, the contact may provide an electrical contact between a solder ball of a BGA of a DUT and an MB of a test equipment. The contact may also act as a spring load wherein it provides a force against the solder ball to ensure the reliability of the electrical connection. FIGS. 3a and 3b depict an example of a contact 335. Specifically, the contact 335 may be similar to contact 135a, 135b, 735a, or 735b. FIG. 3a depicts a top-down view of the contact 335 coupled with routing layer 310 (which may be similar to routing layer 110). FIG. 3b depicts a side view of the contact 335 and the routing layer 310.

As can be seen in FIGS. 3a and 3b, the contact 335 may be generally described as "pie-shaped." Specifically, the contact 335 may be designed to flex and provide pressure against a solder ball of a BGA of a DUT when the solder ball is pressed against the contact 335 from above. In this manner, the contact may act as a spring-load.

Figure 4A:
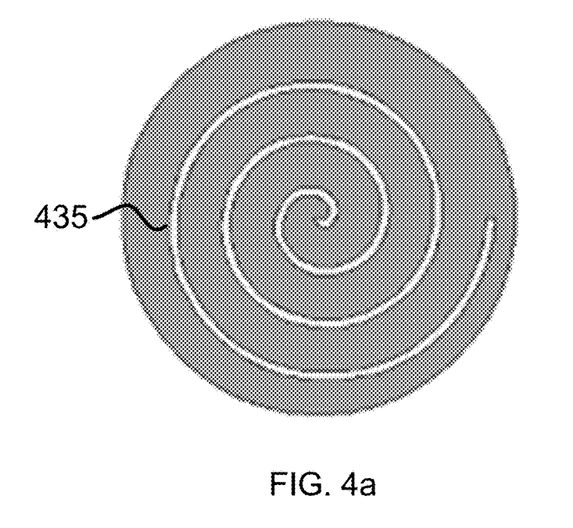
FIGS. 4a and 4b depict an alternate example of a contact of a test equipment, in accordance with various embodiments.
Figure 4B:
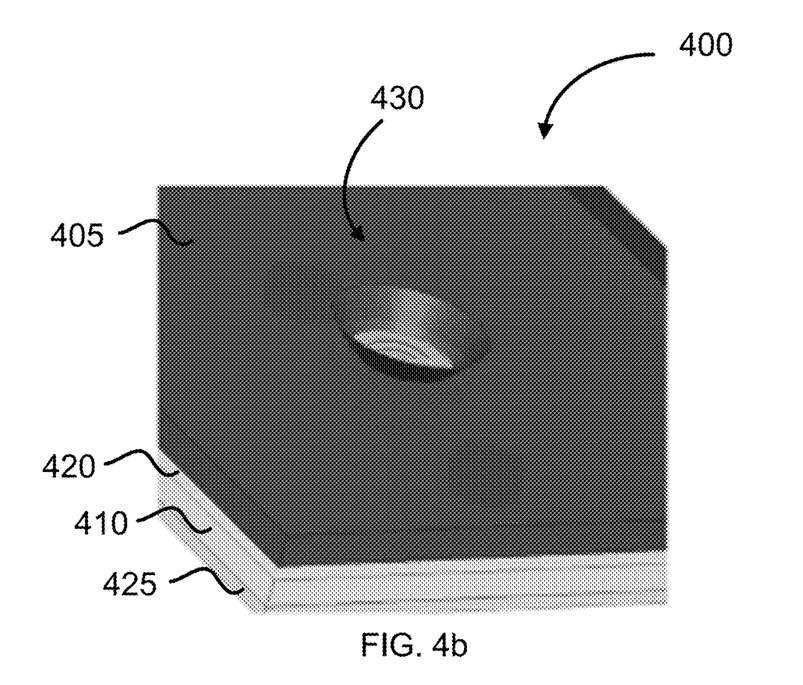

FIGS. 4a and 4b depict an alternate example of a contact of a test equipment. Specifically, FIG. 4a depicts a top-down view of the contact 435, while FIG. 4b depicts a perspective view of the contact 435 in an MB 400 of a test equipment. The contact 435 may be similar to, for example, contacts 135a, 135b, 735a, 735b, or 335. The MB 400 may be similar to, for example, MB 100 and include an outer layer 405, a separation layer 410, and routing layers 420 and 425, which may be respectively similar to outer layer 105, separation layer 110, and routing layers 120 and 125. The MB 400 may further include an opening 430 which may be similar to opening 130a, 130b230, 730a, 730b, etc.

As shown in FIGS. 4a and 4b, contact 435 may have a "spiral" shape. Similarly to the pie shape of contact 335, the spiral shape of contact 435 may allow the contact 435 to flex when a solder ball of a BGA of a DUT is compressed against contact 435. This flexion may therefore allow contact 435 to act as a spring-load.

It will be understood that the example configurations of contacts 135a, 135b, 735a, 735b, 335, and 435 are intended only as examples, and in other embodiments different contacts may have different configurations. Additionally, in embodiments where an MB such as MB 100 or MB 400 has a plurality of contacts, one or more of the plurality of contacts may have a configuration different from another one of the plurality of contacts.

Figure 5:
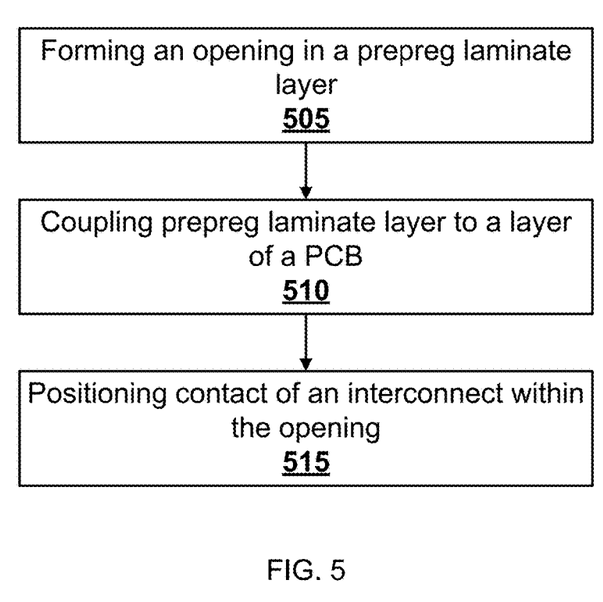
FIG. 5 depicts an example technique for forming a test equipment, in accordance with various embodiments.

FIG. 5 depicts an example process that may be used to generate an MB such as MB 100. Specifically, the process may include, at 505, forming an opening in a prepreg laminate layer. For example, the opening may be an opening such as opening 130a, 130b, 730a, 730b, 230, or 430 that is formed in a prepreg laminate layer such as 105, 205, 705, or 405. The opening may be formed by way of a mechanical drilling operation, laser trepanning, etching, or some other technique. As discussed above, the opening may have a diameter on a first surface of the prepreg layer that is larger than a diameter on an opposing surface of the prepreg layer.

The process may further include, at 510, coupling the prepreg laminate layer to a layer of a PCB. For example, the prepreg layer may be coupled with a routing layer such as routing layer 120. In embodiments, the routing layer may have desirable strength properties based on the material of which it is made. Similarly, the routing layer may have desirable spring properties based on the presence of an element such as a loading mechanism.

The process may further include, at 515, positioning a contact of an interconnect within the opening. For example, the contact may be similar to contacts 135a, 135b, 335, 735a, 735b, or 435. Specifically, in embodiments the contact may be conductive. The contact may be directly coupled with the routing layer. In embodiments, the contact may be positioned within the opening subsequent to the coupling of the prepreg laminate layer to the layer of the PCB at 510. In other embodiments, the contact may be positioned within the opening prior to the coupling of the prepreg laminate layer to the layer of the PCB at 510.

It will be understood that the above-described process is intended as an example, and in other embodiments different parts of the process may be performed in a different order. In some embodiments the process may have additional steps.

Figure 6:
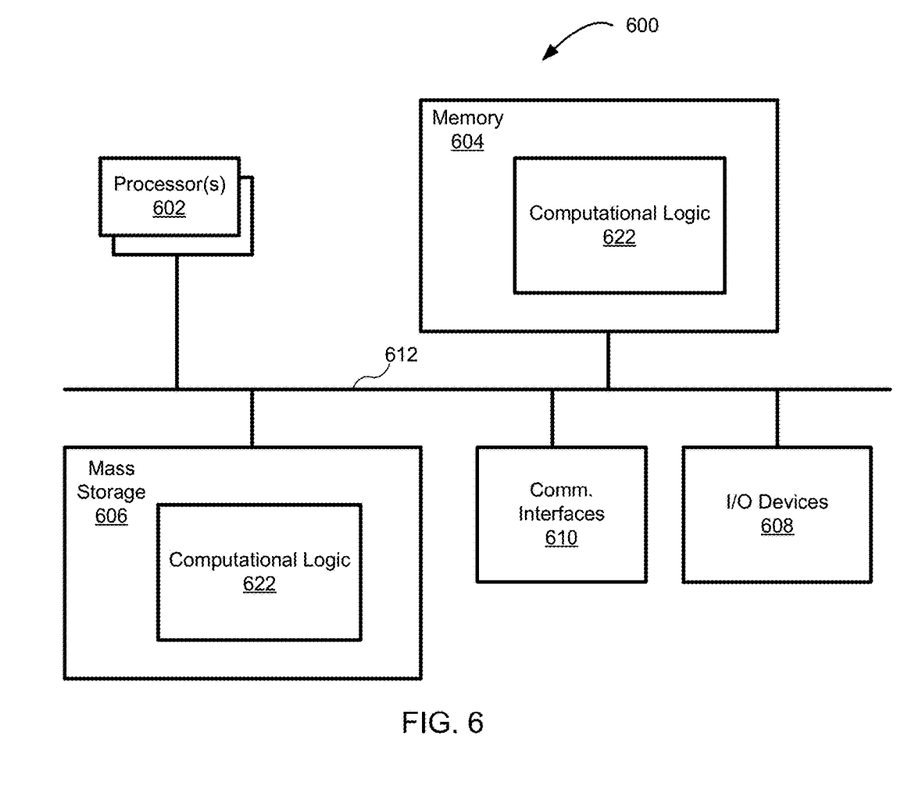
FIG. 6 is a block diagram of an example computing device, in accordance with various embodiments.

FIG. 6 illustrates a block diagram of an example computing device 600 suitable for use with various components of FIGS. 1-4, in accordance with various embodiments. As shown, computing device 600 may include one or more processors or processor cores 602 and system memory 604. For the purpose of this application, including the claims, the terms "processor" and "processor cores" may be considered synonymous, unless the context clearly requires otherwise. The processor 602 may include any type of processors, such as a central processing unit (CPU), a microprocessor, and the like. The processor 602 may be implemented as an integrated circuit having multi-cores, e.g., a multi-core microprocessor. The computing device 600 may include mass storage devices 606 (such as diskette, hard drive, volatile memory (e.g., dynamic random access memory (DRAM), compact disc read-only memory (CD-ROM), digital versatile disk (DVD), and so forth)). In general, system memory 604 and/or mass storage devices 606 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The computing device 600 may further include input/output (I/O) devices 608 (such as a display (e.g., a touchscreen display), keyboard, cursor control, remote control, gaming controller, image capture device, and so forth) and communication interfaces 610 (such as network interface cards, modems, infrared receivers, radio receivers (e.g., Bluetooth), and so forth).

The communication interfaces 610 may include communication chips (not shown) that may be configured to operate the device 600 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 610 may operate in accordance with other wireless protocols in other embodiments.

In some embodiments the communication interfaces 610 or the I/O devices 608 may be or include an MB of a test equipment such as MB 100 or 400. In other embodiments, the communication interfaces 610 or the I/O devices 608 may be communicatively coupled with an MB such as MB 100 by way of a coaxial cable such as coaxial cable 170.

The above-described computing device 600 elements may be coupled to each other via system bus 612, which may represent one or more buses. In the case of multiple buses, they may be bridged by one or more bus bridges (not shown). Each of these elements may perform its conventional functions known in the art. In particular, system memory 604 and mass storage devices 606 may be employed to store a working copy and a permanent copy of the programming instructions for the operation of various components of computing device 600, including but not limited to an operating system of computing device 600 and/or one or more applications. The various elements may be implemented by assembler instructions supported by processor(s) 602 or high-level languages that may be compiled into such instructions.

The permanent copy of the programming instructions may be placed into mass storage devices 606 in the factory, or in the field through, for example, a distribution medium (not shown), such as a compact disc (CD), or through communication interface 610 (from a distribution server (not shown)). That is, one or more distribution media having an implementation of the agent program may be employed to distribute the agent and to program various computing devices.

The number, capability, and/or capacity of the elements 608, 610, 612 may vary, depending on whether computing device 600 is used as a stationary computing device, such as a set-top box or desktop computer, or a mobile computing device, such as a tablet computing device, laptop computer, game console, or smartphone. Their constitutions are otherwise known, and accordingly will not be further described.

In embodiments, memory 604 may include computational logic 622 configured to implement various firmware and/or software services associated with operations of the computing device 600. For some embodiments, at least one of processors 602 may be packaged together with computational logic 622 configured to practice aspects of embodiments described herein to form a System in Package (SiP) or a System on Chip (SoC).

In various implementations, the computing device 600 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 600 may be any other electronic device that processes data.

For an embodiment, at least one of processors 602 may be packaged together with memory having all or portions of computational logic 622 to form a System in Package (SiP). For an embodiment, at least one of processors 602 may be integrated on the same die with memory having all or portions of computational logic 622 to form a System on Chip (SoC).

Machine-readable media (including non-transitory machine-readable media, such as machine-readable storage media), methods, systems and devices for performing the above-described techniques are illustrative examples of embodiments disclosed herein. Additionally, other devices in the above-described interactions may be configured to perform various disclosed techniques.

EXAMPLES

Example 1 may include a printed circuit board (PCB) comprising: a first outer layer and a second outer layer opposite the first outer layer; a routing layer between the first outer layer and the second outer layer; and an interconnect positioned within the first outer layer and coupled with the routing layer, wherein the interconnect includes a contact within an opening in the first outer layer, wherein the contact is within a plane defined by an outer surface of the first outer layer.

Example 2 may include the PCB of example 1, wherein the PCB is a PCB of a test device.

Example 3 may include the PCB of example 1, wherein the contact is a beryllium copper (BeCu) contact.

Example 4 may include the PCB of example 1, wherein a diameter of the opening at the outer surface of the first outer layer is larger than a diameter of the opening at the contact.

Example 5 may include the PCB of example 4, wherein the opening is frusto-conical.

Example 6 may include the PCB of any of examples 1-5, wherein the contact includes a tip able to penetrate an oxidized layer of a solder ball when the PCB is coupled with a ball grid array (BGA).

Example 7 may include the PCB of any of examples 1-5, further comprising a plated via directly coupled with the contact.

Example 8 may include the PCB of example 7, further comprising a mechanical loading mechanism positioned within the plated via.

Example 9 may include the PCB of any of examples 1-5, wherein the contact is a pie-shaped contact or a spiral-shaped contact.

Example 10 may include the PCB of any of examples 1-5, further comprising a coaxial cable positioned within the interconnect and directly coupled with the contact, wherein the coaxial cable extends from the second outer layer.

Example 11 may include a method comprising: forming an opening in a prepreg laminate layer, wherein the opening has a first diameter at a first side of the prepreg laminate layer that is larger than a diameter at a second side of the prepreg laminate layer opposite the first side; coupling the second side of the prepreg laminate layer to a routing layer of a printed circuit board (PCB) such that the opening aligns with a routing layer; and positioning a contact of the routing layer within the opening such that the contact does not extend beyond an outer surface of the outer layer.

Example 12 may include the method of example 11, wherein the PCB is a PCB of a test device.

Example 13 may include the method of example 11, wherein the contact is a beryllium copper (BeCu) contact.

Example 14 may include the method of example 11, wherein the opening is frusto-conical.

Example 15 may include the method of any of examples 11-14, wherein forming the opening includes laser trepanning.

Example 16 may include the method of any of examples 11-14, wherein forming the opening includes mechanical drilling.

Example 17 may include the method of any of examples 11-14, wherein the contact includes a tip able to penetrate an oxidized layer of a solder ball when the PCB is coupled with a ball grid array (BGA).

Example 18 may include the method of any of examples 11-14, wherein the contact is a pie-shaped contact.

Example 19 may include the method of any of examples 11-14, wherein the contact is a spiral-shaped contact.

Example 20 may include the method of any of examples 11-14, wherein the contact is coplanar with the routing layer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

We claim:

1. A printed circuit board (PCB) comprising:
a first outer layer and a second outer layer opposite the first outer layer;
a routing layer between the first outer layer and the second outer layer; and
an interconnect positioned within the first outer layer and coupled with the routing layer, wherein the interconnect includes:
a contact within an opening in the first outer layer, wherein the contact is disposed within a plane defined by an outer surface of the first outer layer, wherein the contact has a flex capability, to provide pressure against a solder ball of a ball grid array (BGA) of a device under test (DUT), in response to a disposition of the DUT on the PCB, wherein the solder ball is to be disposed on the contact; and
a mechanical loading mechanism disposed underneath the contact, to compress and provide a force against the contact, to push the contact against the solder ball in response to the disposition of the DUT on the PCB.

2. The PCB of claim 1, wherein the PCB is a PCB of the DUT.

3. The PCB of claim 1, wherein the contact is a beryllium copper (BeCu) contact.

4. The PCB of claim 1, wherein a diameter of the opening at the outer surface of the first outer layer is larger than a diameter of the opening at the contact.

5. The PCB of claim 4, wherein the opening is frusto-conical.

6. The PCB of claim 1, wherein the contact includes a tip able to penetrate an oxidized layer of a solder ball when the PCB is coupled with a ball grid array (BGA).

7. The PCB of claim 1, further comprising a plated via directly coupled with the contact.

8. The PCB of claim 7, wherein the mechanical loading mechanism is positioned within the plated via.

9. The PCB of claim 1, wherein the contact is a pie-shaped contact or a spiral-shaped contact.

10. The PCB of claim 1, further comprising a coaxial cable positioned within the interconnect and directly coupled with the contact, wherein the coaxial cable extends from the second outer layer.

11. A method comprising:
forming an opening in a prepreg laminate layer, wherein the opening has a first diameter at a first side of the prepreg laminate layer that is larger than a diameter at a second side of the prepreg laminate layer opposite the first side;
coupling the second side of the prepreg laminate layer to a routing layer of a printed circuit board (PCB) such that the opening aligns with the routing layer;
positioning a contact of the routing layer within the opening such that the contact does not extend beyond an outer surface of the outer prepreg laminate layer, the contact having a flex capability, to provide pressure against a solder ball of a ball grid array (BGA) of a device under test (DUT), in response to disposing the DUT on the PCB, wherein the solder ball is to be disposed on the contact; and
disposing a mechanical loading mechanism underneath the contact, to compress and provide a force against the contact, to push the contact against the solder ball in response to the disposition of the DUT on the PCB.

12. The method of claim 11, wherein the PCB is a PCB of the DUT.

13. The method of claim 11, wherein the contact is a beryllium copper (BeCu) contact.

14. The method of claim 11, wherein the opening is frusto-conical.

15. The method of claim 11, wherein forming the opening includes laser trepanning.

16. The method of claim 11, wherein forming the opening includes mechanical drilling.

17. The method of claim 11, wherein the contact includes a tip able to penetrate an oxidized layer of a solder ball when the PCB is coupled with a ball grid array (BGA).

18. The method of claim 11, wherein the contact is a pie-shaped contact.

19. The method of claim 11, wherein the contact is a spiral-shaped contact.

20. The method of claim 11, wherein the contact is coplanar with the routing layer.

* * * * *